United States Patent
Weng et al.

(10) Patent No.: US 7,084,687 B2
(45) Date of Patent: Aug. 1, 2006

(54) PHASE SWALLOW DEVICE AND SIGNAL GENERATOR USING THE SAME

(75) Inventors: Wen-Shiung Weng, Hsin Tien (TW); Ming-Chun Chang, Chia Yi (TW); Chi-Kung Kuan, Tao Yuan (TW); Yi-Shu Chang, Tai Nan (TW); Kuo-Lin Tai, Chu Pei (TW)

(73) Assignee: Realtek Semiconductor Corp., Hsin Chu (TW)

( * ) Notice: Subject to any disclaimer, the term of this patent is extended or adjusted under 35 U.S.C. 154(b) by 12 days.

(21) Appl. No.: 10/896,118

(22) Filed: Jul. 22, 2004

(65) Prior Publication Data

US 2005/0017771 A1 Jan. 27, 2005

(30) Foreign Application Priority Data

Jul. 23, 2003 (TW) ............................... 92120156 A

(51) Int. Cl.
*G06F 1/04* (2006.01)

(52) U.S. Cl. .................................. 327/291; 340/146.2

(58) Field of Classification Search ..................... None
See application file for complete search history.

(56) References Cited

U.S. PATENT DOCUMENTS

| 4,613,980 | A | * | 9/1986 | Newlin et al. | ............... | 375/368 |
| 5,844,934 | A | * | 12/1998 | Lund | ........................... | 375/145 |
| 5,878,101 | A | | 3/1999 | Aisaka | | |
| 5,889,436 | A | * | 3/1999 | Yeung et al. | ................... | 331/2 |
| 6,281,721 | B1 | * | 8/2001 | Kinget et al. | ............... | 327/115 |
| 6,844,785 | B1 | * | 1/2005 | Chiang et al. | ............. | 331/1 A |
| 2004/0196937 | A1 | * | 10/2004 | Wang et al. | ................ | 375/355 |

* cited by examiner

*Primary Examiner*—Timothy P. Callahan
*Assistant Examiner*—Cassandra Cox
(74) *Attorney, Agent, or Firm*—Birch, Stewart, Kolasch & Birch, LLP

(57) ABSTRACT

A signal generator for generating a clock with lower jitter. The signal generator includes a multi-phase clock generator for generating a plurality of multi-phase reference clocks with same frequency, a multiplexer for selecting one reference clock as an output clock according to a phase selecting signal, a phase-swallow control unit having a comparator for comparing a swallow value with a reference value out of order and outputting the comparing result as a swallow control signal, and a clock selector for receiving the swallow control signal and generating the phase selecting signal. Because the reference value is provided by a counter in bit-reversed, the swallow control signal is dispersed smoothly and the jitter of the output clock is reduced.

17 Claims, 6 Drawing Sheets

| Counting Value | A2(C0) | A1(C1) | A0(C2) | Reference Value |
|---|---|---|---|---|
| 0 | 0 | 0 | 0 | 0 |
| 1 | 1 | 0 | 0 | 4 |
| 2 | 0 | 1 | 0 | 2 |
| 3 | 1 | 1 | 0 | 6 |
| 4 | 0 | 0 | 1 | 1 |
| 5 | 1 | 0 | 1 | 5 |
| 6 | 0 | 1 | 1 | 3 |
| 7 | 1 | 1 | 1 | 7 |

PHASE SWALLOW DEVICE AND SIGNAL GENERATOR USING THE SAME

This application claims the benefit of Taiwan application serial no. 092120156, filed on Jul. 23, 2003, the subject matter of which is incorporated herein by reference.

BACKGROUND OF THE INVENTION

1. Field of the Invention

The present invention relates to a phase swallow device and a signal generator, and more particularly to a phase swallow device for outputting a clock with lower jitter and a signal generator using the same.

2. Description of the Related Art

FIG. 1 illustrates the architecture of a conventional signal generator. The signal generator 10 is used to generate a frequency synthesis clock. The frequency of the synthesis clock is adjusted according to user's requirements. The signal generator 10 includes a multi-phase clock generator 11, a multiplexer (MUX) 12, a phase-swallow control unit 14, and a clock selector 15. The multi-phase clock generator 11 generates a plurality of multi-phase reference clocks CK0, CK1 . . . CKn-1 with same frequency according to a reference clock. FIG. 2 shows waveforms of eight multi-phase reference clocks CK0, CK1 . . . CK7. The multiplexer 12 receives the plurality of multi-phase reference clocks CK0, CK1 . . . CKn-1, and selects one of the multi-phase reference clocks as an output clock according to a phase selecting signal. The phase-swallow control unit 14 generates a swallow control signal (SCS) according to a swallow value. The clock selector 15 outputs the phase selecting signal according to the swallow control signal SCS. The clock selector 15 may be a counter triggered by the swallow control signal SCS, and the counter is used for counting the swallow control signal SCS and outputs the counting value as the phase selecting signal. When the swallow control signal SCS is enabled, for example from 0 to 1, the value of the counter is increased. Thus, the multiplexer 12 selects the clock with next phase as the output clock. Consequently, the frequency of the output clock of the signal generator 10 is finely adjusted according to the number of enabling the swallow control signal SCS.

In general, the conventional phase-swallow control unit utilizes a sigma-delta modulator to achieve the requirements of precisely controlling the output frequency and making the cycle jitter small. Taking the one-order sigma-delta modulator as an example, the embodiment thereof may be an accumulator having a circuit area larger than that of the typical logic device (e.g., AND gate, OR gate, or flip-flop).

To meet the circuit design requirement of small circuit area and dimension, the conventional phase-swallow control unit utilizes a counter, which may be regarded as being composed of a plurality of flip-flops, to achieve this requirement, as shown in FIG. 3. FIG. 3 illustrates a block diagram showing a conventional phase-swallow control unit. Referring to this drawing, the phase-swallow control unit 14 includes a counter 31, a comparator 32, and a register 33. The counter 31 counts the pulse number of a counting clock, and outputs the counting value to the comparator 32. The register 33 stores the swallow value. The comparator 32 compares the counting value outputted from the counter 31 with the swallow value stored in the register 33. That is, when the counting value is smaller than the swallow value, the swallow control signal SCS is enabled, for example 1; or otherwise the swallow control signal SCS is disabled, for example 0, when the counting value is greater than or equal to the swallow value. Consequently, as shown in FIG. 3, the low bit of the counting value is compared to the low bit of the swallow value, and the high bit of the counting value is compared to the high bit of the swallow value.

In the architecture of FIG. 3, the phase thereof is continuously swallowed. For example, if the phase difference equals three phases, the conventional phase swallow method is performed by swallowing one phase in each clock cycle of the continuous three clock cycles. Consequently, the cycle-cycle jitter of the output clock of the signal generator 10 is large. According to the system requirement, the output clock may be divided by a proper value so as to obtain the required frequency. That is, a frequency divider (not shown) is utilized to receive and then divide the clock outputted from the multiplexer 12. When three phases are to be continuously swallowed in 8 pulse cycles and the frequency divider is divided by 3, the maximum cycle-cycle jitter is 3ΔT, wherein ΔT is the phase difference between two adjacent multi-phase reference clocks. In addition, as the swallowed phases become greater, the maximum cycle-cycle jitter becomes larger.

SUMMARY OF THE INVENTION

In view of the above-mentioned problems, it is therefore an object of the invention to provide a phase swallow device with low cycle-cycle jitter and a signal generator using the same.

To achieve the above-mentioned object, the signal generator of the invention includes a multi-phase clock generator for receiving a reference clock and generating a plurality of multi-phase reference clocks with same frequency, a multiplexer for receiving the multi-phase reference clocks and selecting one reference clock as an output clock according to a phase selecting signal, a phase-swallow control unit having a comparator for receiving a swallow value and a reference value and generating a swallow control signal, and a clock selector for receiving the swallow control signal and generating the phase selecting signal. The above-mentioned comparator generates the swallow control signal according to a result of comparing a series of bits of a swallow value with a series of bits of a reference value, wherein the reference value is not compared with the swallow values in bit sequence.

In the phase-swallow control unit, because the reference value is not compared with the swallow value in bit sequence, the swallow control signal generated by the phase-swallow control unit is not continuous and may be regarded as evenly distributed. Thus, the cycle-cycle jitter of the output clock of the signal generator is reduced.

DETAILED DESCRIPTION OF THE INVENTION

The phase swallow device of the invention and the signal generator using the same will be described with reference to the accompanying drawings.

Figure 1:
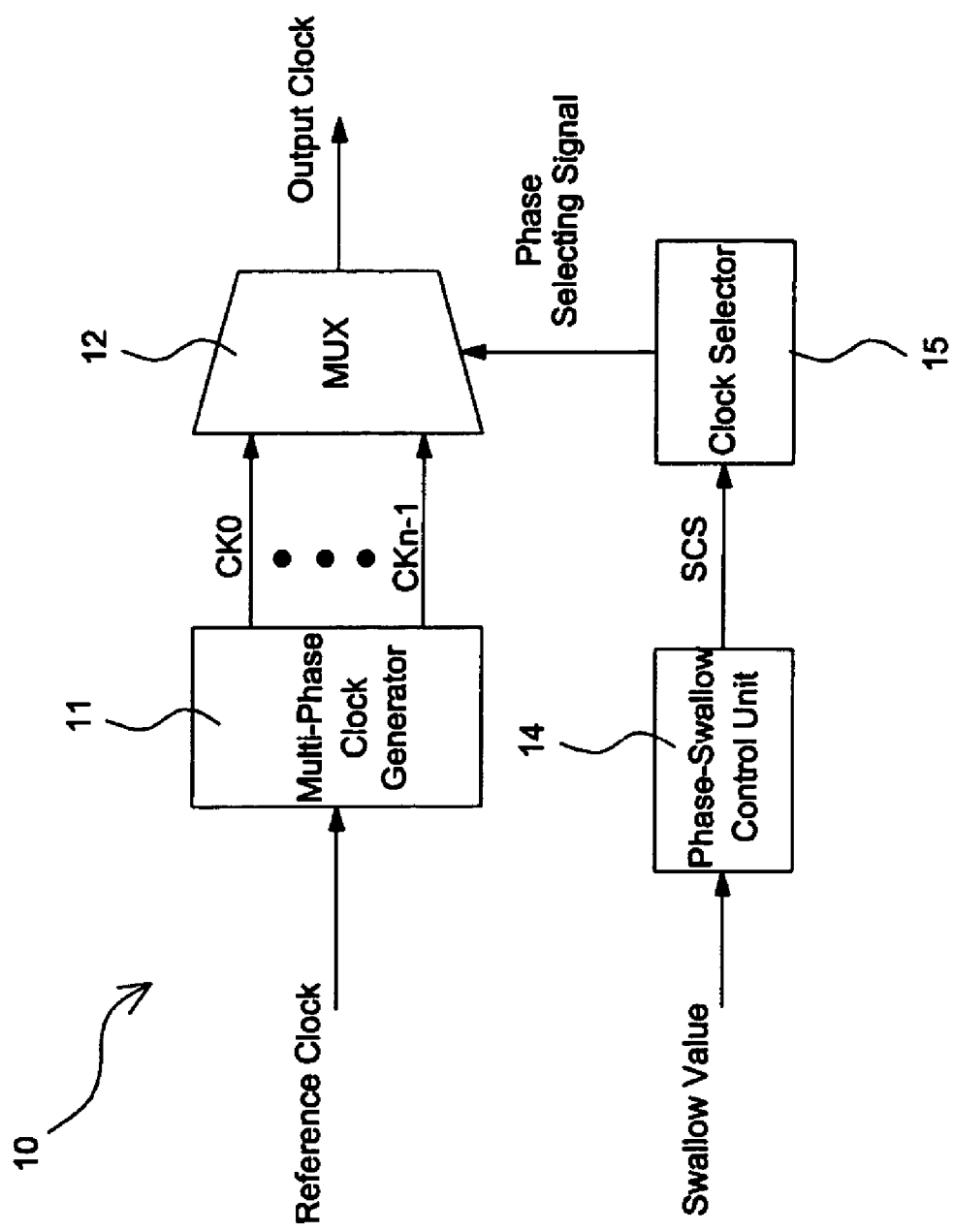
FIG. 1 illustrates the architecture of a conventional signal generator.
Figure 2:
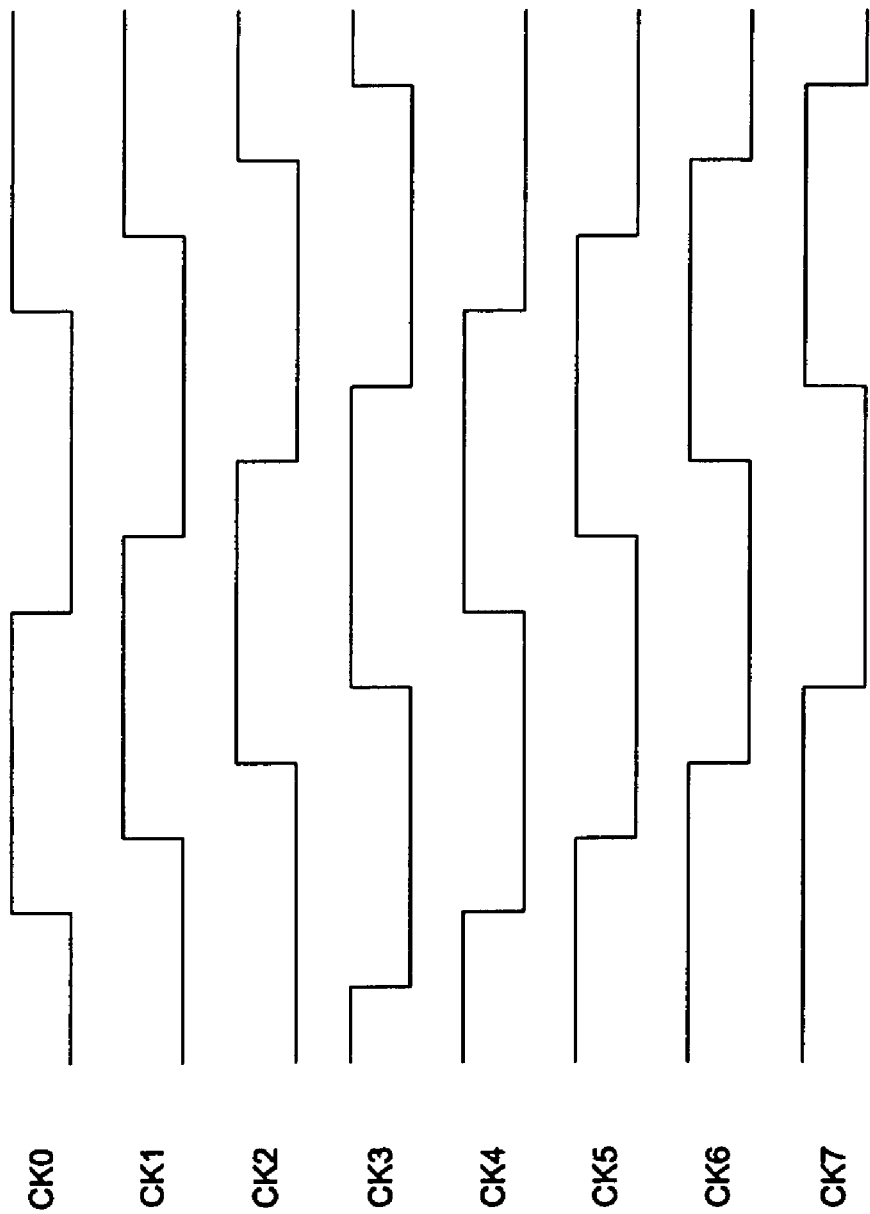
FIG. 2 shows waveforms of a plurality of multi-phase clocks.
Figure 3:
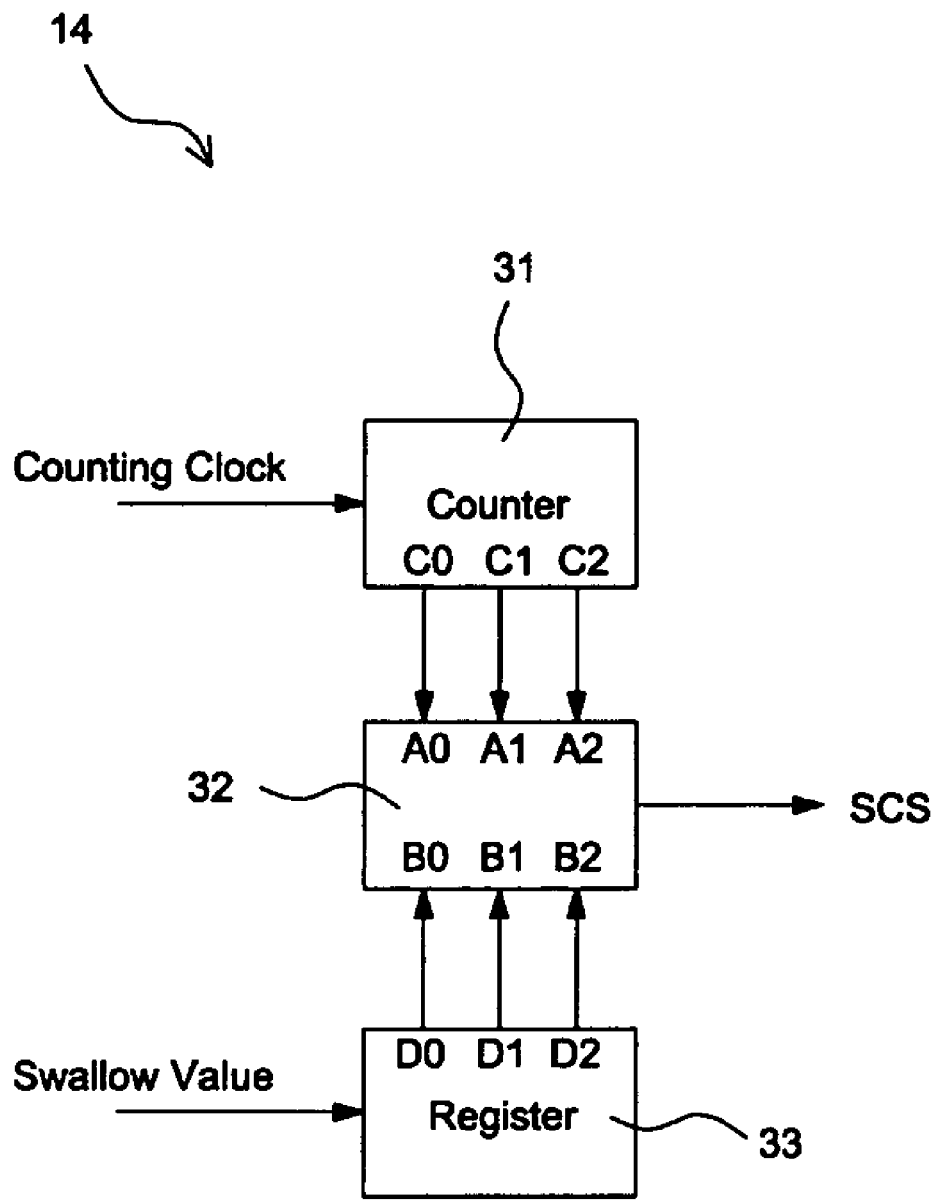
FIG. 3 illustrates a block diagram showing a conventional phase-swallow control unit.
Figure 4:
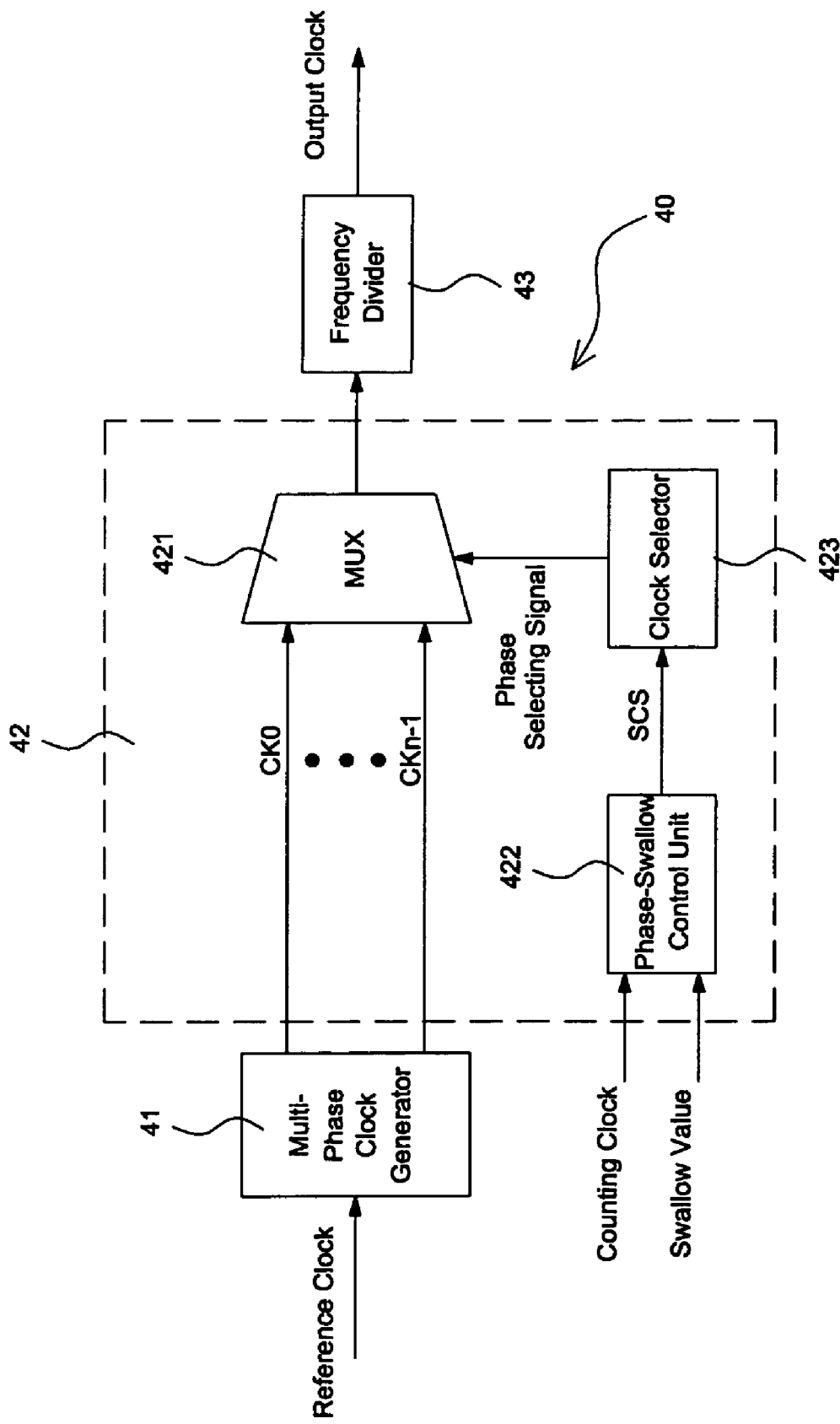
FIG. 4 illustrates the architecture of a signal generator of the present invention.

FIG. 4 illustrates the architecture of a signal generator of the present invention. The signal generator 40 of the present invention includes a multi-phase clock generator 41, a phase swallow device 42, and a frequency divider 43. The phase swallow device 42 includes a multiplexer 421, a phase-swallow control unit 422, and a clock selector 423. The multi-phase clock generator 41 generates a plurality of multi-phase reference clocks CK0, CK1 . . . CKn-1 with same frequency according to a reference clock. The phase-swallow control unit 422 generates a swallow control signal SCS according to a result of comparing a series of bits of a swallow value with a series of bits of a reference value out of order. According to the swallow control signal SCS, the clock selector 423 outputs a phase selecting signal. The multiplexer 421 receives the phase selecting signal and the plurality of multi-phase reference clocks and then selects at least one reference clock from the multi-phase reference clocks for output according to the phase selecting signal. Thus, by controlling the swallow value, the demanded reference clock is selected and then outputted to the frequency divider 43 so that the frequency divider 43 can output a divided output clock. In an embodiment, the bits of the swallow value is compared with the bits of the reference value out of order, hence the swallow control signal SCS generated by the phase-swallow control unit 422 is discrete and the maximum cycle-cycle jitter can be reduced. The further specification is illustrated in the following description accompanying with FIG. 5, FIG. 6, and FIG. 7.

Because the architectures and functions of the multi-phase clock generator 41, the multiplexer 421, the frequency divider 43 of the signal generator 40 are the same as those of the conventional signal generator, detailed descriptions thereof will be omitted. In an embodiment, the clock selector 423 is a counter for counting the pulse of the swallow control signal SCS and outputting the phase selecting signal.

Figures 5, 6:
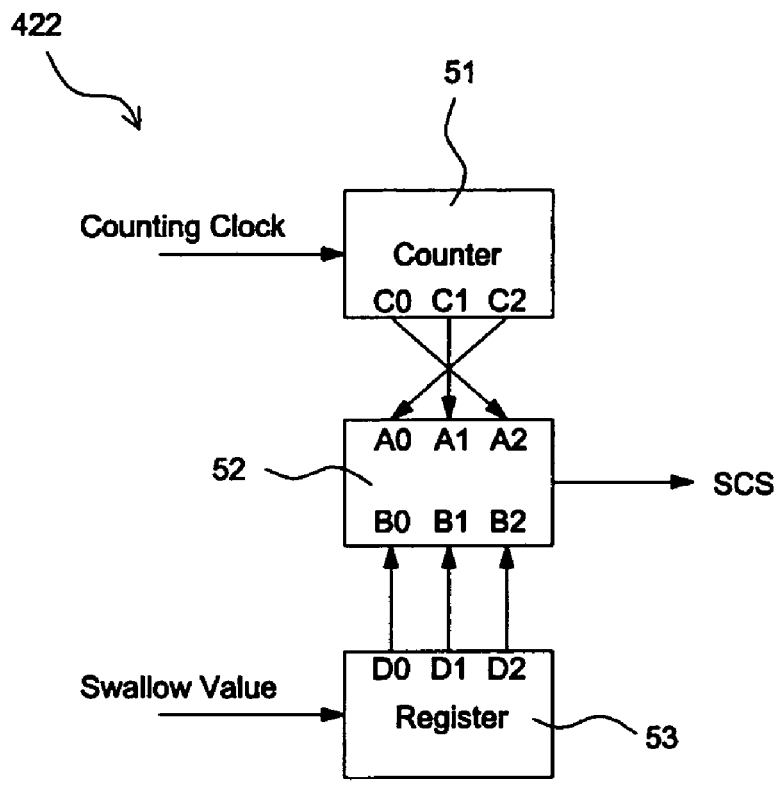
FIG. 5 illustrates a circuit of the phase-swallow control unit of FIG. 4.
FIG. 6 shows the relationship between the counting value and the reference value received by the comparator of FIG. 5.

FIG. 5 illustrates the phase-swallow control unit of FIG. 4. Referring to FIG. 5, the phase-swallow control unit 422 includes a counter 51, a comparator 52, and a register 53. The counter 51 counts the pulse number of the counting clock and outputs the counting value to the comparator 52. The register 53 stores the swallow value. In this embodiment, the counting value of the counter 51 is transmitted to the comparator 52 in bit-reverse. That is, the lowest bit C0 of the counter 51 is connected to A2 of the comparator 52, the middle bit C1 of the counter 51 is connected to A1 of the comparator 52, and the highest bit C2 of the counter 51 is connected to A0 of the comparator 52. In addition, the lowest bit D0 of the register 53 is connected to B0 of the comparator 52, the middle bit D1 of the register 53 is connected to B1 of the comparator 52, and the highest bit D2 of the register 53 is connected to B2 of the comparator 52. Consequently, the bits of the counter are compared with the bits of the register out of order and these results in the discrete swallow control signal.

FIG. 6 shows the relationship between the counting value and the reference value received by the comparator of FIG. 5. The counting value is inputted to the comparator 52 in bit-inversed and regarded as the reference value, wherein the reference value is for comparing with the swallow value. As shown in FIG. 6, the counting value is increased one-by-one, but the reference value is dispersively distributed. Then the comparator 52 compares the reference value with the swallow value and generates the swallow control signal. According to this property, after the comparator compares the bits of the reference value with the bits of the swallow value out of order, the swallow control signal of the comparator is not continuous and may be regarded as dispersively distributed. Of course, the method for implementing the above-mentioned circuit is not limited to the description. It is possible to perform logic operations using AND gate or XOR gate directly on the swallow value and the reference pulse. Such performance is in a manner not following the bit order without departing from the spirit of the invention for achieving the dispersive effects in the non-bit order.

Figure 7:
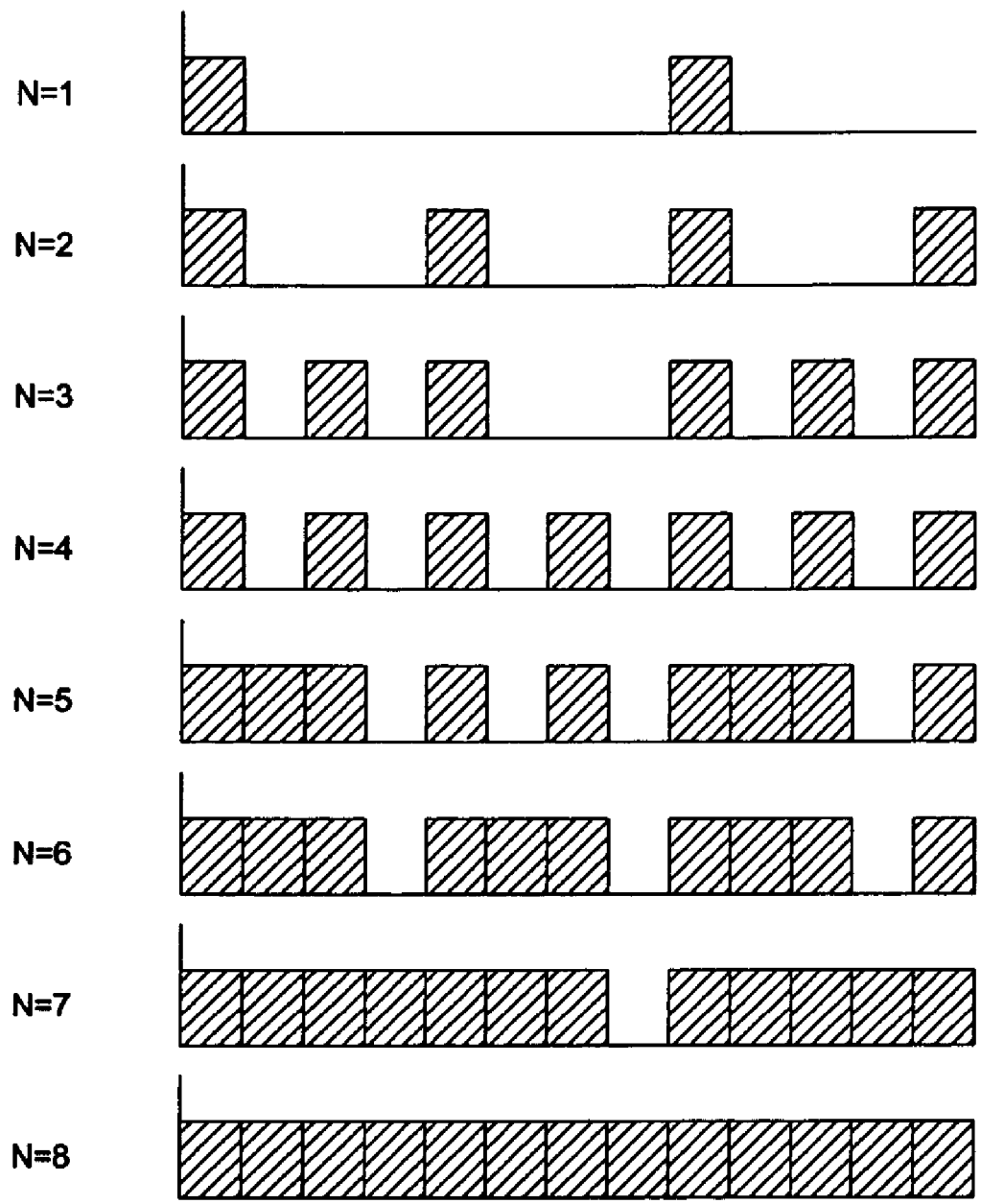
FIG. 7 shows phase swallow conditions corresponding to different swallow values, wherein the hatched regions denote the regions with the enabled swallow control signal SCS, and N is the swallow value.

FIG. 7 shows phase swallow conditions corresponding to different swallow values, wherein the hatched regions denote the regions with the enabled swallow control signal SCS, and N is the swallow value. Eight multi-phase reference clocks are assumed in the condition of FIG. 7. As shown in FIG. 7, the time points of phase swallowing have been dispersed because the bits of the swallow value are compared to the bits of the reference value out of order. The maximum cycle-cycle jitter of the present invention has two situations. When the divisor of the frequency divider is an even number, the maximum cycle-cycle jitter is 0 or $\Delta T$, wherein $\Delta T$ is the phase difference between two adjacent multi-phase reference clocks. When the divisor of the frequency divider is an odd number, the maximum cycle-cycle jitter is $2\Delta T$. To sum up, by comparing the bits of the swallow value to the bits of the reference value out of order, the maximum cycle-cycle jitter of the present invention is limited below $2\Delta T$.

Consequently, the signal generator of the invention can generate an output clock with lower jitter. While certain exemplary embodiments have been described and shown in the accompanying drawings, it is to be understood that such embodiments are merely illustrative of and not restrictive on the broad invention, and that this invention not be limited to the specific construction and arrangement shown and described, since various other modifications may occur to those ordinarily skilled in the art.

What is claimed is:

1. A phase swallow device, which receives a plurality of multi-phase reference clocks with same frequency and generates an output clock, the phase swallow device comprising:
   a phase-swallow control unit for comparing a swallow value to a reference value out of order and outputting a phase selecting signal according to the compared result; and
   a multiplexer for receiving the multi-phase reference clocks and selecting at least one reference clock as the output clock according to the phase selecting signal.

2. The phase swallow device of claim 1, wherein the phase-swallow control unit further comprises a register for storing and outputting the swallow value.

3. The phase swallow device of claim 1, wherein the phase-swallow control unit further comprises a counter for counting the pulse number of the compared result to generate the phase selecting signal.

4. The phase swallow device of claim 3, wherein the reference value is provided by the counter in bit-inversed.

5. The phase swallow device of claim 1, wherein the phase-swallow control unit comprises a comparator for comparing the swallow value and the reference value and generating the compared result.

6. The phase swallow device of claim 5, wherein the phase-swallow device further comprises a clock selector for outputting the phase selecting signal by counting the pulse number of the compared result.

7. A signal generator, comprising:
- a multi-phase clock generator for generating a plurality of multi-phase reference clocks with same frequency;
- a phase-swallow control unit having a comparator for comparing a swallow value with a reference value out of order and outputting a comparing result as a swallow control signal;
- a clock selector for receiving the swallow control signal and generating a phase selecting signal; and
- a multiplexer for receiving the multi-phase reference clocks and selecting at least one reference clock as an output clock according to the phase selecting signal.

8. The signal generator of claim 7, wherein the phase-swallow control unit further comprises a register for storing and outputting the swallow value.

9. The signal generator of claim 7, wherein the phase-swallow control unit further comprising a counter for counting the pulse number of a reference clock.

10. The signal generator of claim 9, wherein the reference value is provided by the counter in bit-inversed.

11. The signal generator of claim 10, further comprising a frequency divider for receiving and dividing the output clock of the multiplexer and then outputting the divided output clock.

12. The signal generator of claim 7, wherein the clock selector is a counter.

13. A method for generating an output clock, comprising:
- generating a plurality of multi-phase reference clocks with same frequency;
- comparing a swallow value with a reference value out of order and outputting a compared result;
- generating a phase selecting signal according to the compared result; and
- selecting at least one of the multi-phase reference clocks as the output clock according to the phase selecting signal.

14. The method of claim 13, wherein the swallow value is programmable.

15. The method of claim 13, further comprising:
- dividing the output clock and outputting a divided output clock.

16. The method of claim 13, wherein the step of generating a phase selecting signal comprises:
- counting the pulse number of the compared result to generate the phase selecting signal.

17. The method of claim 13, wherein the reference value is provided by a counter in bit-inversed.

\* \* \* \* \*